United States Patent [19]

Purser

[11] Patent Number: 4,967,078
[45] Date of Patent: Oct. 30, 1990

[54] RUTHERFORD BACKSCATTERING SURFACE ANALYZER WITH 180-DEGREE DEFLECTING AND FOCUSING PERMANENT MAGNET

[75] Inventor: Kenneth H. Purser, Lexington, Mass.

[73] Assignee: Genus, Inc., Mountain View, Calif.

[21] Appl. No.: 474,476

[22] Filed: Feb. 2, 1990

[51] Int. Cl.$^5$ .................. H01J 37/252; H05H 5/06
[52] U.S. Cl. .................. 250/309; 328/230; 328/233
[58] Field of Search ............ 250/309, 305; 328/230, 328/233

[56] References Cited

U.S. PATENT DOCUMENTS 3,209,269  9/1965  Julian et al. .................. 328/233
3,683,287  8/1972  Miessner .................. 328/233

OTHER PUBLICATIONS

Fogel et al., Soviet Physics–Technical Physics (5), 1960, pp. 58–65.

*Primary Examiner*—Jack I. Berman
*Attorney, Agent, or Firm*—Henry C. Nields

[57] ABSTRACT

A Rutherford backscattering analyzer comprising in combination:
a hollow electrode,
a voltage source for impressing upon said hollow electrode a positive voltage of the order of $10^6$ volts,
a first acceleration tube connected between said voltage source and ground,
a second acceleration tube connected said voltage source and ground,
a deflecting magnet within said terminal having pole pieces between which is supported an evacuated region connecting said acceleration tubes to each other,
a source of positive helium ions,
a lithium charge-exchange canal,
means for analyzing said helium ions and directing them into said canal,
an electron stripper within said terminal,
said magnet being adapted to direct said stripped ions into said second acceleration tube for acceleration therethrough,
a sample holder for holding a sample to be analyzed in the path of the ions emerging from said second acceleration tube, and
means for analyzing the energy and yield of helium ions backscattered from said sample,
said magnet including permanently magnetized members producing a magnetic flux of a least 3000 gauss and having a magnetic hardness no less than that of samarium cobalt.

1 Claim, 3 Drawing Sheets

RUTHERFORD BACKSCATTERING SURFACE ANALYZER WITH 180-DEGREE DEFLECTING AND FOCUSING PERMANENT MAGNET

BACKGROUND OF THE INVENTION

This invention relates to particle acceleration apparatus, and in particular to a device for the acceleration of helium ions by a tandem-type direct-voltage accelerator. In tandem accelerators, negative ions are produced and accelerated by a direct voltage to a terminal which is maintained at a high positive voltage. Within this high-voltage terminal the negative ions are caused to pass through a stripping device (either a gas or a foil) so that a substantial number of them are converted to positive ions, which are then accelerated away from the positive terminal back to ground potential, where they may be used for various purposes. In this way the ultimate energy of the particles is at least twice that which would correspond to acceleration by a direct voltage of the amount on the high-voltage terminal; the production of multiply-charged particles results in even higher energies.

A common application of tandem accelerators has been the use of this principle in direct-voltage accelerators designed for the maximum voltage attainable by the state of the art, in order to achieve particle energies higher than those attainable by "single-pass" acceleration. However, the tandem principle has also found use in lower-voltage accelerators, since it permits the manufacture of smaller "multi-pass" accelerators to achieve the same end result as that achieved by larger "single-pass" accelerators.

Because of the relatively high initial cost and high maintenance requirements of particle accelerators, they have often been designed for versatility. Thus, most tandem accelerators have been designed for the acceleration of virtually all types of ions for various purposes. This has meant that these accelerators were required to be capable of variation in their parameters, such as the electric and magnetic fields which cause deflection and focusing of the ion beam.

SUMMARY OF THE INVENTION

This invention relates to a tandem accelerator which is dedicated to a specific purpose: namely, Rutherford backscattering surface analysis. By dedicating the accelerator to a specific purpose, all the components of the accelerator may be made smaller and more compact, resulting not only in reduced capital and maintenance costs, but also in an overall size which, unlike prior art devices, is well suited to the dimensions of the average research laboratory. This is important in the case of surface analysis, because the conventional laboratories in which such analysis is performed do not have the large space which is made available for laboratories which are specifically designed for such matters as nuclear research, involving not only very large accelerator equipment, but also supporting apparatus and staff.

A particular feature of the invention comprehends apparatus within the high-voltage terminal for redirecting the ion beam back in the direction from which it came upon arrival at the high-voltage terminal. Specially designed apparatus creates a magnetic field of just the right configuration to deflect and focus the particular particles used in the device, so that the emergent ion beam has the desired properties.

DETAILED DESCRIPTION OF A PREFERRED EMBODIMENT

The invention may best be understood from the following detailed description thereof, having reference to the accompanying drawings, in which.

Figure 1:
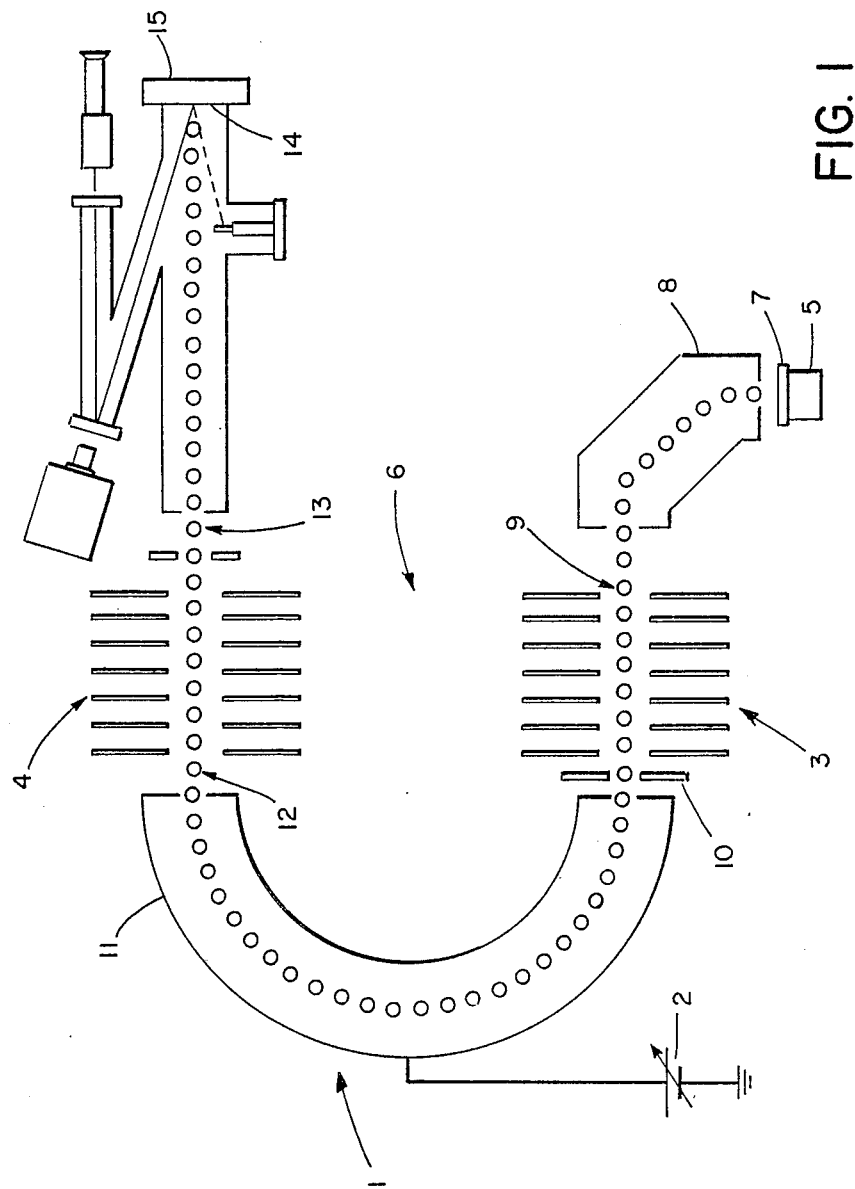
FIG. 1 is a schematic illustration of the overall apparatus of the invention.

Referring to the drawings, and first to FIG. 1 thereof, a high-voltage terminal 1 is maintained at a positive voltage of 660 kilovolts by a suitable high-voltage power supply 2 such as that described in U.S. Pat. No. 2,375,394 to Cleland. Between the terminal 1 and ground there are supported two acceleration tubes, each of which comprises a multiplicity of alternating insulating rings and electrode disks hermetically sealed to provide an evacuated acceleration region.

One of these acceleration tubes, shown at 3, is adapted for the acceleration of negative ions from ground to the terminal 1, and the other, shown at 4, is adapted for the acceleration of positive ions from the terminal 1 to ground.

Positive helium ions are produced in an ion source 5 with an initial energy of 20 keV. The ion source 5 is external to the accelerator structure 6. In order to take advantage of the tandem acceleration principle, these $He^{++}$ particles must first be changed to the negative ionic species. This is achieved in a lithium charge exchange canal 7. After leaving the exchange canal 7 the negative ions are analyzed by an analyzing magnet 8, so that only those ions having the desired properties can enter the acceleration tube 3.

The negative helium ions thus produced are injected into the negative ion acceleration tube 3 and attracted in the form of a negative ion beam 9 to the positive 660-kilovolt terminal 1, achieving an energy of 680 keV. It should be noted that, although the initial positive helium ions were doubly charged, the negative helium ions have only one electronic charge.

Within the terminal 1, the negative ions of the beam 9 pass through a thin carbon foil 10 and undergo a second charge changing process in which they are stripped of one or more electrons. Most of the negative ions in the beam 9 now become singly and doubly charged positive ions which are mass analyzed for $He^{++}$ by an 180-degree deflecting and focusing magnet 11 within the terminal 1. These doubly charged positive ions are then repelled from the positive terminal 1, accelerated again, this time as a positive ion beam 12, and will have gained an additional 1.32 MeV energy as they emerge from the accelerator. The resultant 2.0 MeV ion beam 13 is directed onto a sample 14 for Rutherford backscattering surface analysis.

A solid state energy detector (not shown), coupled to a multi-channel analyzer (not shown) measures the energy and yield of the backscattered helium ions. With the aid of a dedicated Rutherford-backscattering-surface-analyzer software package and a personal computer (not shown), a backscattered spectrum is constructed and displayed on the video screen (not shown).

The energy of the emergent beam is fixed at 2 MeV He++. The beam current is adjustable to at least 50 nanoamperes minimum current. The beam spot size is 2 millimeters by 2 millimeters.

The sample 14 is supported on a sample target holder 15 which can have light beam alignment, X-Y positioning adjustment of up to plus or minus 25.4 millimeters and angulation about two axes.

A simple, push-button micro processor control (not shown) is provided for all instrument functions, including sample pump down. A user-friendly software package is provided for data acquisition and spectral analysis. The overall unit has a small "footprint": i.e., it is less than 10 feet long by 5 feet wide by 6 feet high.

Figure 2:
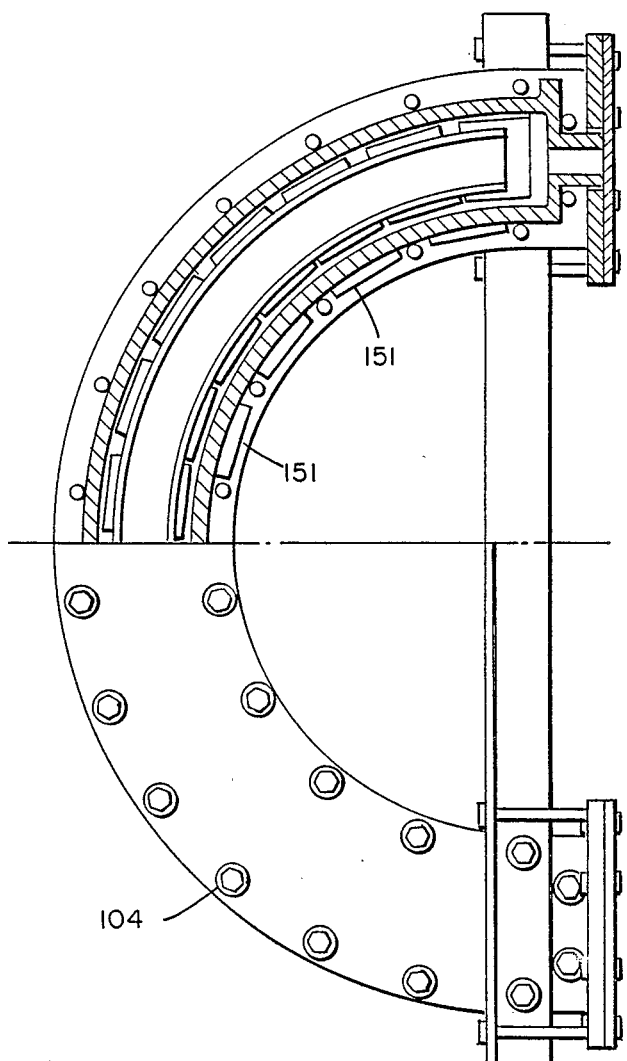
FIG. 2 is a central section of the high-voltage terminal, showing the position of the deflecting magnet of the invention.
Figure 4:
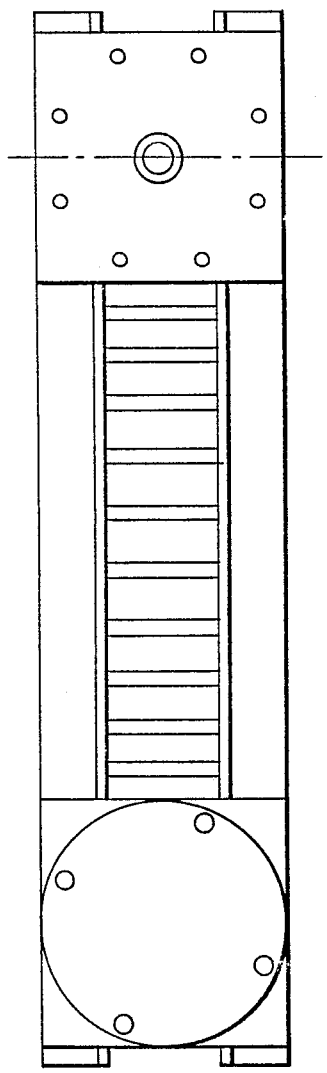
FIG. 4 is a side elevation of the deflecting magnet of the invention.
Figure 3:
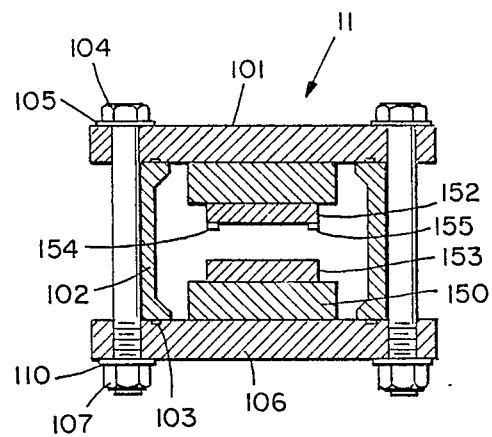
FIG. 3 is a section along the line 3—3 of FIG. 2, showing the shape of the pole faces of the deflecting magnet of the invention.

Referring now to FIGS. 2-4, therein is shown the deflecting and focusing magnet 11. Steel plates 101 and 106 are bolted to each other by bolts 104 each having a washer 105 and a washer 110 and a nut 107, all disposed in a semicircle as shown in FIG. 2. Between the plates 101, 106 there are disposed a series of steel members 102, which supply a return flux path for the magnetic circuit. Gaskets 103 provide hermetic sealing for the evacuated region within the magnet 11.

The magnetic flux is produced by a series of blocks 150 of samarium cobalt which have been magnetized to produce a flux in the gap of 4500 gauss. Samarium cobalt is not only able to generate fluxes of this magnitude, but it is also a material which is "hard" magnetically: that is to say, it retains its magnetism for a long period of time. My invention is not limited, however, to samarium cobalt, but includes the use of any material which is capable of being magnetized to a flux in excess of 3000 gauss and which is magnetically "hard". The blocks 150 are magnetized to a flux in excess of that ultimately desired, and the effective flux is then reduced by means of the return yokes 102, which have substantial reluctance. Fine-tuning of the flux is then obtained by the use of shims 151, which selectively increase the flux at various portions of the ion beam path.

The geometry of the flux through which the beam passes is actually determined by pole pieces 152, 153 of steel. The shape of the faces of the pole pieces 152, 153 is somewhat critical, although it is not necessary that they be machined to the actual hyperbolic shape which is theoretically indicated. The magnetic field through which the beam passes must be uniform as one proceeds along the beam path, but decreasing slightly in the radial direction for purposes of focusing. In addition, the pole pieces 152, 153 have outer ridges 154, 155 which serve to linealize the magnetic field by suppressing the bulges in the flux lines which would normally occur in the gap between the pole pieces 152, 153. The geometry of the pieces of the magnet 11 is critical, since unwanted leakage flux destroys the effectiveness of the device.

The use of a permanent magnet in the terminal is an important feature of my invention. Most tandem accelerators in the prior art allow the beam to continue on through the high-voltage terminal. Those prior-art tandem accelerators which have employed deflecting magnets in the high-voltage terminal have all used electromagnetic devices rather than permanent magnets, presumably in the belief that adjustments to such magnets would be essential during use of the accelerator. However, because of the various features of the permanent magnet of my invention, as set forth in the claims herein, the parameters of such a magnet are fixed during manufacture, and no adjustments are necessary during operation of the accelerator. This eliminates the need for power supplies within the terminal to adjust the magnetic field, and increases the overall reliability of the apparatus. In this way, important savings are achieved in space, power and weight. Moreover, the use of a magnet with a flux of 4500 gauss means that the radius of curvature of the 680 keV He++ ions during traversal of the terminal can be ten inches, rendering possible the construction of a machine small enough to fit within the confines of a conventional materials analysis laboratory.

The slight slant of the faces of the pole pieces 152, 153 is required for focusing in the vertical (or "Y") direction, in order that both X and Y focusing may be equal: i.e., in order that focusing may be stigmatic. Of course, the introduction of this perturbation in the magnetic field to improve Y focusing necessarily impairs X focusing, and a compromise arrangement is inherent.

The adjusting shims 151 are made of steel blocks and are glued in place by a dab of epoxy resin in order to ensure immobility during transport and use.

The permanent magnet 11 in the terminal 1 thus not only supplies 180° deflection, but also renders unnecessary the energy reference which is customarily used in the normal accelerator system, employing a deflecting magnet at the output of the accelerator and slits for sensing the beam.

Having thus described the principles of the invention, together with an illustrative embodiment thereof, it is to be understood that although specific terms are employed they are used in a generic and descriptive sense, and not for purposes of limitation, the scope of the invention being set forth in the following claims:

I claim:

1. A Rutherford backscattering surface analyzer comprising in combination:
   a hollow electrode,
   a voltage source for impressing upon said hollow electrode a positive voltage of the order of $10^6$ volts,
   a first acceleration tube connected between said voltage source and ground,
   a second acceleration tube connected between said voltage source and ground,
   a deflecting magnet within said terminal having pole pieces between which is supported an evacuated region connecting said acceleration tubes to each other,
   a source of positive helium ions,
   a lithium charge-exchange canal,
   means for analyzing said helium ions and directing them into said canal,
   an electron stripper within said terminal,
   said magnet being adapted to direct said stripped ions into said second acceleration tube for acceleration therethrough,
   a sample holder for holding a sample to be analyzed in the path of the ions emerging from said second acceleration tube, and
   means for analyzing the energy and yield of helium ions backscattered from said sample,
   said magnet including permanently magnetized members producing a magnetic flux of a least 3000 gauss and having a magnetic hardness no less than that of samarium cobalt.

* * * * *